(12) United States Patent
Vincent et al.

(10) Patent No.: US 12,740,428 B2
(45) Date of Patent: Sep. 15, 2026

(54) PITCH-REDUCING SOLDER INTERCONNECT FOR RF TRANSITIONS

(71) Applicant: NXP USA, Inc., Austin, TX (US)

(72) Inventors: Michael B. Vincent, Chandler, AZ (US); Nikita Mahjabeen, Austin, TX (US)

(73) Assignee: NXP USA, INC., Austin, TX (US)

( * ) Notice: Subject to any disclaimer, the term of this patent is extended or adjusted under 35 U.S.C. 154(b) by 375 days.

(21) Appl. No.: 18/513,861

(22) Filed: Nov. 20, 2023

(65) Prior Publication Data

US 2025/0167142 A1 May 22, 2025

(51) Int. Cl.

*H10W 44/20* (2026.01)
*H10W 70/05* (2026.01)
*H10W 70/685* (2026.01)
*H10W 74/01* (2026.01)
*H10W 74/10* (2026.01)
*H10W 90/00* (2026.01)
*H10W 72/00* (2026.01)
*H10W 72/90* (2026.01)
*H10W 80/00* (2026.01)

(52) U.S. Cl.

CPC ........... *H10W 44/20* (2026.01); *H10W 70/05* (2026.01); *H10W 70/685* (2026.01); *H10W 74/016* (2026.01); *H10W 74/111* (2026.01); *H10W 90/00* (2026.01); *H10W 44/216* (2026.01); *H10W 44/248* (2026.01); *H10W 72/07236* (2026.01); *H10W 72/932* (2026.01); *H10W 80/732* (2026.01); *H10W 90/724* (2026.01)

(58) Field of Classification Search

CPC ... H10W 44/20; H10W 70/685; H10W 90/00; H10W 70/05
USPC .......................................................... 361/767
See application file for complete search history.

(56) References Cited

U.S. PATENT DOCUMENTS

| | | | | |
|---|---|---|---|---|
| 5,300,815 | A * | 4/1994 | Rostoker ................. | H01L 24/06 257/E23.128 |
| 6,392,292 | B1 | 5/2002 | Morishita | |
| 7,036,710 | B1 | 5/2006 | Bartley et al. | |
| 9,089,060 | B1 | 7/2015 | Azeroual et al. | |
| 2016/0013144 | A1 | 1/2016 | Chen | |
| 2017/0005052 | A1 * | 1/2017 | Chen ........................ | H01L 24/13 |
| 2024/0147624 | A1 * | 5/2024 | Tsuboi .................. | H05K 1/111 |

FOREIGN PATENT DOCUMENTS

| | | | |
|---|---|---|---|
| WO | 2023218719 | A1 | 11/2023 |

OTHER PUBLICATIONS

Ai-Chie, Wang et al; "Considerations for Package Routing for DRAM and NAND Flash Memory"; IEEE Electronics Packaging Technology Conference; pp. 774-779 (Dec. 3, 2014).

* cited by examiner

*Primary Examiner* — Binh B Tran

(57) ABSTRACT

A radio frequency (RF) transition mechanism between an integrated circuit (IC) package and an interposer circuit board includes elongated structures to reduce a distance between conductors. Pairs of electrical interconnect pads on the IC package and/or pairs of electrical interconnect pads on the interposer circuit board are elongated on a common axis. The reduced distance between conductors reduces insertion loss at frequencies of interest.

27 Claims, 8 Drawing Sheets

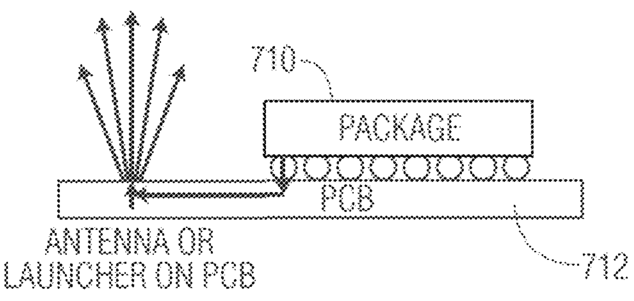
FIG. 7A
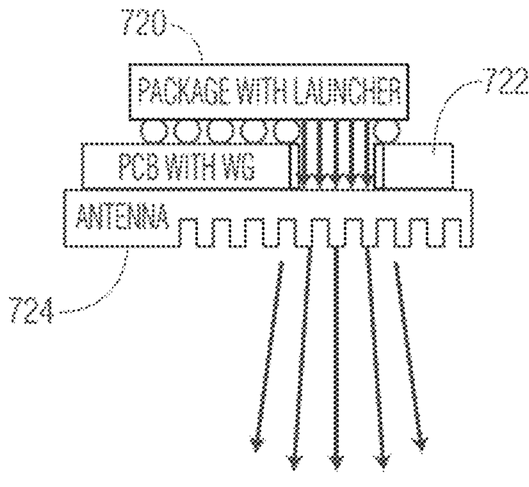
FIG. 7B
730
PACKAGE WITH ANTENNA
PCB
732
FIG. 7C

PITCH-REDUCING SOLDER INTERCONNECT FOR RF TRANSITIONS

TECHNICAL FIELD

Embodiments of the subject matter described herein relate to structures and devices for coupling millimeter-wave signals generated by electronic devices to external structures.

BACKGROUND

Miniaturized integrated circuits for millimeter-wave communications and other applications are often coupled to external structures (e.g., antennae) to function as intended. In some applications, a launcher configured to couple millimeter-wave radiation is integrated in a device package along with one or more millimeter-wave integrated circuits. In these applications, device package size and cost is typically increased to accommodate the launcher.

SUMMARY

In an example embodiment, a system includes an integrated circuit device having a first pair of electrical interconnect pads with solderable surfaces; and an interposer circuit board having a second pair of electrical interconnect pads with solderable surfaces, and a first pair of conductive paths spaced to create a radio frequency (RF) transmission line. The second pair of electrical interconnect pads are configured to provide electrical coupling to the first pair of electrical interconnect pads through solder connections, and the first pair of conductive paths are electrically coupled to the second pair of electrical interconnect pads. The first pair of electrical interconnect pads are noncircular and elongated on a common axis and are configured, during a solder reflow process, to cause solder to flow in a direction of the common axis to form an RF transition between the integrated circuit device and the interposer circuit board.

Additional example embodiments of the system include the first pair of electrical interconnect pads being elongated directly toward each other on the common axis, or being elongated at an angle relative to the common axis, to provide a component of elongation on the common axis. The first pair of electrical interconnect pads may be arranged according to a first pitch, and the second pair of electrical interconnect pads may be arranged according to a second pitch, and the first pitch and second pitch may be equal or unequal. The integrated circuit device may include a bare integrated circuit die, and the first pair of electrical interconnect pads may be formed on the bare integrated circuit die. Further, the integrated circuit device may include a bare integrated circuit die; a polymer layer formed on the bare integrated circuit die, wherein the polymer layer includes a plurality of conductive traces to redistribute electrical connections from the bare integrated circuit die; and a metallization layer formed on the polymer layer, wherein the metallization layer includes the first pair of electrical interconnect pads having solderable surfaces. The first pair of electrical interconnect pads may also be noncircular and elongated, where the RF transition between the integrated circuit device and the interposer circuit board is formed between the first pair of electrical interconnect pads and the second pair of electrical interconnect pads. Further, the interposer circuit board may include an RF launcher electrically coupled to the RF transmission line on the interposer circuit board.

In another example embodiment, a device (an interposer circuit board) includes a first pair of conductive paths having a first spacing to create a radio frequency (RF) transmission line; and a first pair of electrical interconnect pads having solderable surfaces configured to be electrically coupled to an integrated circuit device using solder connections, wherein the first pair of electrical interconnect pads have a second spacing greater than the first spacing, and wherein the first pair of electrical interconnect pads are electrically coupled to the RF transmission line, the first pair of electrical interconnect pads are noncircular and elongated on a common axis and are configured, during a solder reflow process, to cause solder to flow in a direction of the common axis to form an RF transition between the integrated circuit device and the interposer circuit board.

Additional example embodiments of the interposer circuit board include a plurality of noncircular, elongated pairs of electrical interconnect pads, and wherein the first pair of electrical interconnect pads is one of the plurality of noncircular, elongated pairs of electrical interconnect pads, an RF launcher electrically coupled to the RF transmission line, and/or plurality of electrical interconnect pads arranged in a pattern corresponding to an arrangement of contacts of a ball grid array (BGA) package, wherein the plurality of electrical interconnect pads comprise the first pair of electrical interconnect pads. Further, the first pair of electrical interconnect pads may be elongated directly toward each other on the common axis, or may be elongated at an angle relative to the common axis, to provide a component of elongation on the common axis.

In another example embodiment, a device (an integrated circuit device) includes a radio frequency (RF) circuit configured to produce RF energy; and a first pair of electrical interconnect pads with solderable surfaces configured to provide electrical coupling to a circuit board using solder connections; wherein the first pair of electrical interconnect pads are electrically coupled to the RF circuit to conduct the RF energy, the first pair of electrical interconnect pads are noncircular and elongated on a common axis and are configured, during a solder reflow process, to cause solder to flow in a direction of the common axis to form an RF transition between the integrated circuit device and the circuit board.

Additional example embodiments of the integrated circuit device include a bare integrated circuit die, where the first pair of electrical interconnect pads are formed on the bare integrated circuit die. Further, the integrated circuit device may include a bare integrated circuit die that includes the RF circuit; a polymer layer formed on the bare integrated circuit die, wherein the polymer layer includes a plurality of conductive traces to redistribute electrical connections from the bare integrated circuit die; and a metallization layer formed on the polymer layer, wherein the metallization layer includes the first pair of electrical interconnect pads with solderable surfaces. The integrated circuit device may also include a plurality of noncircular, elongated pairs of electrical interconnect pads, where the first pair of electrical interconnect pads is one of the plurality of noncircular, elongated pairs of electrical interconnect pads. Additionally, the integrated circuit device may include a plurality of electrical interconnect pads arranged in a pattern corresponding to an arrangement of contacts of a ball grid array (BGA) package, wherein the plurality of electrical interconnect pads comprise the first pair of electrical interconnect pads.

In another example embodiment, a method includes fabricating an interposer circuit board having a first pair of conductive paths spaced to form a radio frequency (RF) transmission line, and having a first pair of electrical interconnect pads with solderable surfaces being noncircular and elongated on a common axis, wherein the first pair of electrical interconnect pads are electrically coupled to the RF transmission line; and electrically coupling an integrated circuit device to the interposer circuit board, wherein the electrically coupling comprises performing a solder reflow operation to allow solder to flow in a direction of the common axis of the first pair of electrical interconnect pads.

Additional example embodiments of the method may include the integrated circuit device having a pair of circular or noncircular electrical interconnect pads spaced to be electrically coupled to the first pair of electrical interconnect pads on the interposer circuit board. In further example embodiments, the method may include molding over an integrated circuit die to produce a molded integrated circuit device, wherein the integrated circuit die includes an RF circuit configured to produce RF energy; forming a polymer layer on the molded integrated circuit device, wherein the polymer layer includes a second plurality of conductive paths to redistribute interconnects on the molded integrated circuit device to a ball grid array pattern having a pitch compatible with the interposer circuit board, wherein a second pair of the second plurality of conductive paths are electrically coupled to conduct the RF energy; and forming a metallization layer on the polymer layer to form the integrated circuit device, wherein the metallization layer includes a second pair of electrical interconnect pads electrically coupled to the second pair of the second plurality of conductive paths on the polymer layer to conduct the RF energy, wherein the second pair of electrical interconnect pads are spaced to be electrically coupled to the first pair of electrical interconnect pads on the interposer circuit board during the solder reflow operation to form an RF transition between the integrated circuit device and the interposer circuit board.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

FIGS. 7A-7C are cross-sectional illustrations showing example embodiments of systems that include RF transitions.

DETAILED DESCRIPTION

Figure 1:
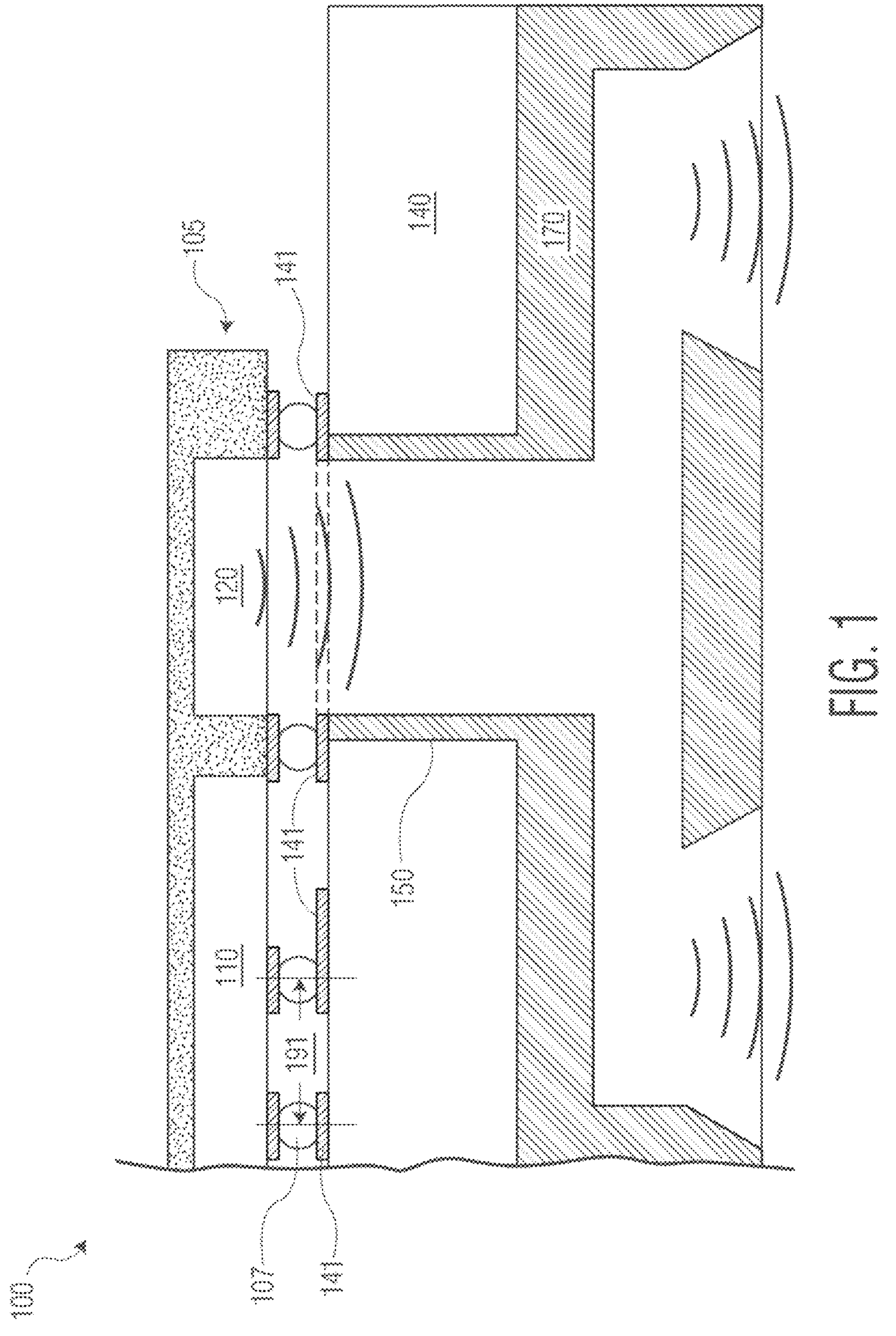
FIG. 1 is a cross-sectional illustration of an electronic device package that includes a millimeter-wave transmitter and a launcher that is coupled to a printed circuit board having an integrated wave guide.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are nonlimiting examples of suitable processes according to embodiments and are for the purposes of illustration. Systems and devices according to embodiments herein may be use any suitable processes including those that omit steps described above, perform those steps and similar steps in different orders, and the like. It will also be appreciated that well-known features may be omitted for clarity.

Unless explicitly stated otherwise, the use of terms "approximately," "substantially" and similar terms in connection with dimensions, relative positioning, or orientation of various features indicates that the dimensions, positioning, or orientation of those features are subject to tolerances and/or expected process variations of equipment and processes chosen to form the described features. Unless explicitly stated otherwise, the use of terms "approximately," "substantially" and similar terms in connection with measurable values or characteristics is subject to the expected measurement accuracy of equipment and methods used to measure those values or characteristics and/or within tolerance limits specified by technical standards applicable to the technologies described.

Miniaturization of radiofrequency and microwave electronics for generating and receiving wireless signals present challenges because of the need for structures such as antennae to couple signals from packaged components (e.g., individual chips, systems on a chip, multichip packages, and the like) to free space. While it can be desirable to integrate such structures directly into a chip package, doing so tends to significantly increase the package size because the minimum dimensions of an antenna are often comparable or significantly larger than the effective wavelength of the signals being transmitted. This can increase production costs and introduce undesirable geometric constraints on component placement within larger systems and devices. Some of these constraints are mitigated at higher frequencies such as the 30-300 GHz range ("millimeter waves", having free-space wavelengths between 1-10 mm) because of the reduced size requirements of components such as antennae and waveguides in the millimeter-wave regime compared to lower frequency regimes (i.e., in the MHz range and lower). However, integration of millimeter-wave launchers and other structures can still significantly limit minimum package sizes relative to the size of individual integrated circuits, as illustrated by FIG. 1.

FIG. 1 is a cross-sectional view of an example system in one approach. The system 100 includes an integrated circuit package (the IC package 105) that contains a radio frequency (RF) circuit (e.g., a millimeter-wave integrated circuit) (the IC 110) which is coupled to a millimeter-wave waveguide transition (a launcher 120) that allows RF signals generated by the IC 110 to be coupled to an external antenna structure 170. The IC package 105 may be a ball-grid array (BGA) type package and is shown with solder bumps 107 bonding the IC package 105 to contacts 141 on a substrate 140 (which may be a modified printed circuit board, for example). The substrate 140 includes a waveguide section 150 that is coupled to the antenna section 170, thereby allowing RF signals generated by the IC 110 to be converted into wireless signals that propagate from the launcher 120 into the waveguide section 150 and finally into the antenna 170 which can radiate the signals into the surrounding environment. As shown, the walls of the waveguide section 150 are conductive (e.g., metallized) such that the waveguide section operates as a rectangular waveguide defined by electrically conductive walls with a center that can be filled with a dielectric material such as dielectric material of the substrate 140. Alternatively, the waveguide section 150 and similar structures described herein may be air-filled, gas-filled, or evacuated cavities within a substrate such as the substrate 140.

It will be appreciated that integrating the launcher 120 into the IC package 105 means that the IC package 105 must be larger than both the launcher 120 and the IC 110 individually. Furthermore, integration of the launcher 120 into the IC package 105 introduces constraints on the placement of solder bumps (e.g., the solder bumps 107) or other structures used to couple the IC package 105 to the substrate 140 via the contacts 141. This is because the path between the launcher 120 and the waveguide section 150 cannot be obstructed by conductive material. Placement of the IC package 105 on the substrate 140 is also constrained because the launcher 120 must be positioned directly over the waveguide section 150 to allow radiated energy to be effectively coupled from the launcher 120 into the waveguide section 150. The solder bumps 107 (or other electrical interconnections between the IC package 105 and the substrate 140) may be arranged in order to maintain compatibility with conventional circuit board designs. For example, the solder bumps 107 (or other interconnections) may be spaced with a minimum spacing indicated by the dimension 191 and/or spaced with a regular pitch defined by the dimension 191.

Figure 2A:
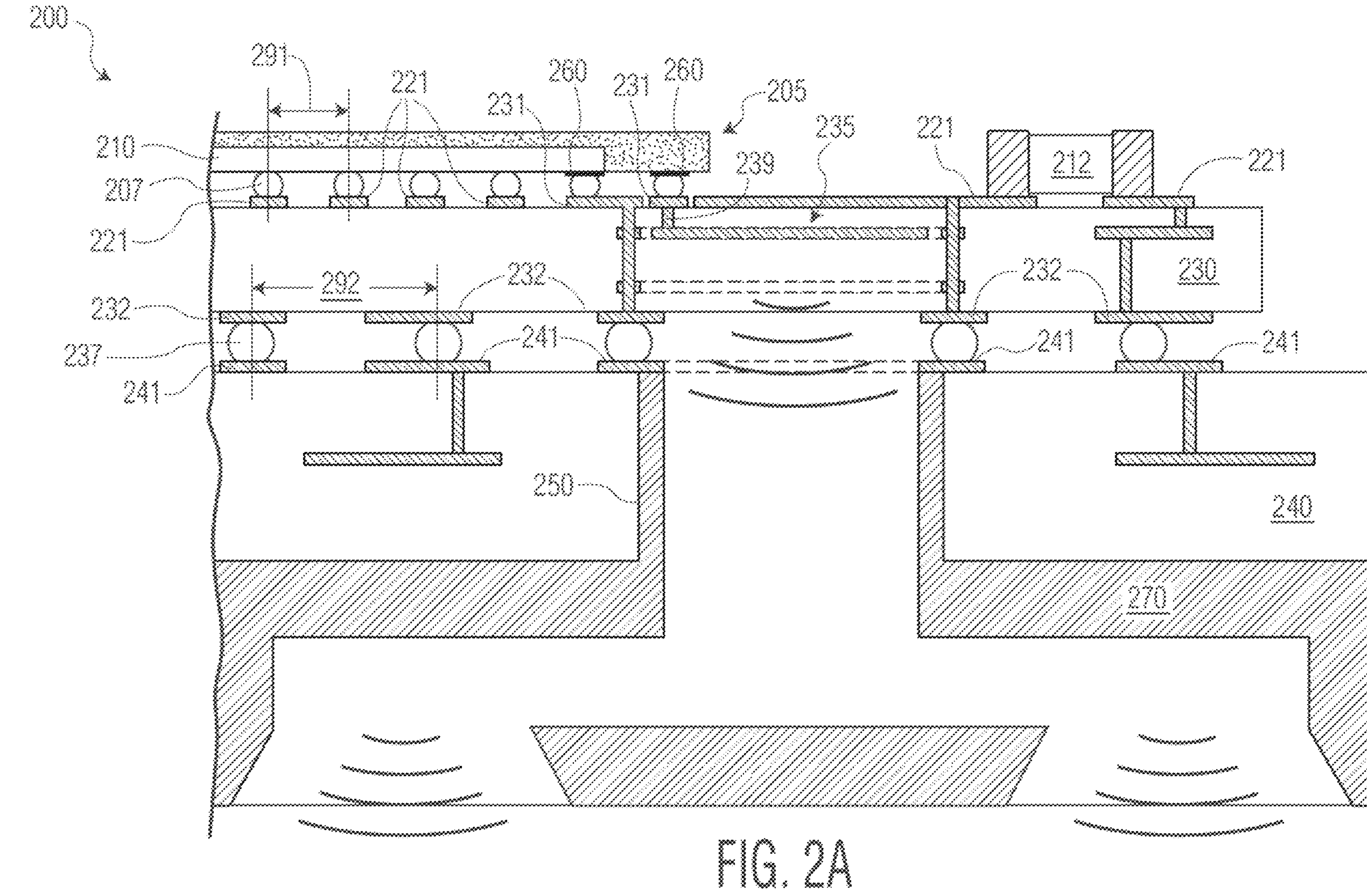
FIG. 2A is a cross-sectional illustration of an electronic device package and system according to one or more embodiments that includes a packaged mm-Wave device coupled to a printed circuit board interposer with an integrated millimeter wave launcher.

Accordingly, embodiments herein allow for reduced package sizes for ICs, such as the IC 110, and related components while facilitating integration with external antenna structures such as the antenna section 170 and the like. FIG. 2A shows an example system according to one or more embodiments herein.

The system 200 includes a package 205 and a substrate 240 (e.g., the substrate 140) with a waveguide section 250 (e.g., the waveguide section 150) coupled to an antenna section 270 (e.g., the antenna section 170). The IC package 205 includes an integrated circuit (an IC 210; e.g., the IC 110) and is shown with solder bumps 207 bonding the IC package 205 to an interposer 230 which may be a printed circuit board (PCB) substrate or any other suitable substrate having the features described further below.

The interposer 230 has multiple set of contacts 221, 231 on its top side allowing components such as the IC 210 in the IC package 205 and other components such as the component 212 (represented as a discrete passive device such as an inductor or resistor, as a nonlimiting example) to be physically coupled to the interposer 230. As shown, the IC package 205 is coupled to the contacts 221, 231 on the top surface of the interposer by solder bumps 207, and the component 212 is depicted as being surface mounted to contacts 221 on the top surface of the interposer via solder reflow, or any other acceptable method, as nonlimiting examples. Components such as the IC package 205 and the component 212 may be electrically coupled as needed to contacts (e.g., contacts 241) on the substrate 240 via a second set of contacts 232 on the bottom of the interposer 230 that are in turn coupled to the substrate 240 (e.g., via solder bumps 237, as shown or by any other suitable method). The contacts 221, 231 on the top side of the interposer 230 can be connected as needed to the contacts 232 on the bottom side in order to enable electrical connections between components such as the IC package 210 and the component 212 on the top surface of the interposer 230.

In some embodiments, the interposer 230 includes a transition structure (e.g., a launcher 235) which can function similarly to the launcher 120 of FIG. 1, with one difference being that the launcher 235 is disposed within the interposer 230 rather than within the IC package 205. As shown in FIG. 2A, RF signals (e.g., millimeter-wave signals) can be coupled from the IC 210 to the launcher 235 via a feed contact 239 coupled to one of the solder ball connections 207. It will be understood that the IC 210 within the IC package 205 is shown directly connected to the feed contact 239 via a solder bump connection (one of the solder bumps 207) for purposes of illustration, but that any suitable connection method may be used. For example, the IC package 205 may be positioned away from the launcher 235 and coupled to the feed contact 239 via a conductive trace or path on or within the interposer 230. It will be further understood that nothing herein is intended to require the use solder bump connections. Rather, any suitable structures and methods can be used including solder reflow, conductive adhesives, and the like as nonlimiting examples.

In some embodiments, an RF signal generated by the IC 210 is propagated to the interposer 230 through a pair of electrical interconnect pads having solderable surfaces 260 on the IC package 205 through the solder balls 207 to the pair of electrical interconnect pads having solderable surfaces 231 on the interposer 230. In the example of FIG. 2A, the pair of electrical contacts 231 couple the RF energy to the launcher 235. In some embodiments, interposer 230 includes conductive traces or paths coupled to the pair of electrical contacts 231, where the conductive paths are spaced to form an RF transmission line to efficiently propagate the RF energy to the launcher 235. Also in some embodiments, the IC package 205 may include conductive traces or paths to propagate the same RF energy from the IC 210 to the pair of electrical contacts 260 on the IC package 205, where the conductive paths are spaced to form an RF transmission line to efficiently propagate the RF energy from the IC 210 to the pair of electrical contacts 260. Conductive traces/paths and solderable surfaces may be formed on either or both of the IC 210 and the IC package 205 in any suitable manner. For example, a polymer layer may be formed on the underside of the IC 210. The polymer layer may include conductive traces to redistribute the IC interconnect from the surface area occupied by the IC 210 to a larger surface area occupied by the IC package 205. Also for example, a metallization layer may be formed on the polymer layer, and the solderable surfaces of the electrical contact pads 260 may be formed within the metallization layer.

As shown in FIG. 2A, some embodiments include a launcher disposed on or within the interposer 230. In some embodiments, a launcher is not included within interposer 230, and the RF energy coupled between the IC package 205 and the interposer 230 is propagated to an RF transition structure other than a launcher. For example, RF energy received by the interposer 230 may be propagated using RF transmission lines formed on or within the interposer 230 to a connector suitable to couple the RF energy to an external structure. Also for example, RF energy received by the interposer 230 may be coupled to other interconnect devices formed between the interposer 230 and the substrate 240.

It will be understood that the configuration of components in systems and devices such as the system 200 including an interposer such as the interposer 230 can confer various advantages. As one example, interposers according to one or more embodiments can have arrangements of contacts that are not typically supported by conventional chip assembly processes, while retaining compatibility with conventional circuit board layouts via compatible contacts on the bottom of the interposer (e.g., the solder bumps 237 of FIG. 2A). For example, the solder bumps 207 may have a spacing defined by the dimension 291 which may be smaller than supported by conventional printed circuit board assembly processes. Meanwhile, the solder bumps 237 on the opposite side of the interposer 230 may have a spacing defined by the dimension 292 that may maintain compatibility with conventional assembly processes. As a result, chip packages such as the IC package 205 can be made more compact while still being compatible with conventional printed circuit board layouts and/or conventional design rules when the interposer 230 is bonded to a circuit board or other substrate such as the substrate 240 as pictured. Similarly, the solder bumps 207 or other contacts on interposers such as the interposer 230 may be smaller than conventional solder bumps or other contacts while the solder bump 237 or other contacts on such interposers may be conventionally sized.

Another potential advantage of the use of interposers such as the interposer 230 is the ability to place such packages containing millimeter-wave components such as the IC 210 remotely, away from structures such as the launcher 235 or the waveguide section 250, allowing for greater flexibility in the design of larger systems built on printed circuit boards or similar substrates such as the substrate 240.

Figure 2B:
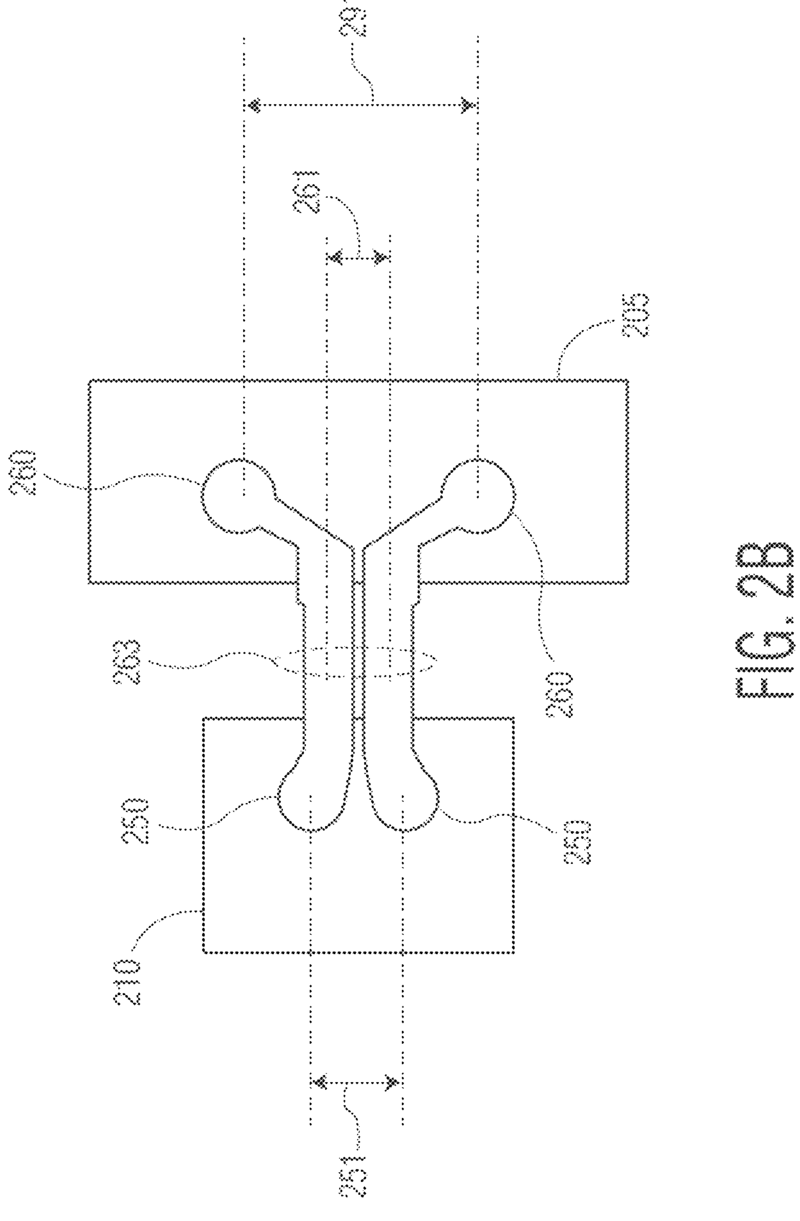
FIG. 2B is a top plan view illustration of electrical interconnects between devices represented in FIG. 2A.

FIG. 2B is a top plan view illustration of electrical interconnects between devices represented in FIG. 2A. As shown in FIG. 2B, in some embodiments, integrated circuit interconnect 250 on the underside of the IC 210 is electrically coupled to the electrical interconnect pads 260 by conductive traces 263. Conductive traces 263 have a spacing represented by dimension 261 that forms an RF transmission line at the frequency of interest to efficiently propagate RF signals between the IC 210 and the electrical interconnect pads 260 on the underside of the IC package 205. The electric interconnect 250 on the underside of the IC package 205 has a pitch represented by dimension 251 that allows for an efficient transfer of RF energy from the IC 210 to conductive traces 263. Conductive traces 263 terminate at electrical interconnect pads 260, which may have a pitch represented by distance 291, also shown in FIG. 2A. In part because the spacing between the electrical interconnect pads 260 is typically larger than the spacing between the conductive traces 263 that form an RF transmission line, the RF transition formed between the IC package 205 and the interposer 230 at electrical interconnect pads 260 may introduce an undesirable level of insertion loss without further embodiments capable of reducing the spacing (e.g., dimension 291).

In some embodiments, the pair of electrical interconnect pads 260 are elongated on a common axis toward each other to reduce an effective distance between the conductive elements that result after solder reflow, to reduce RF insertion loss and to provide a more efficient transfer of RF energy between the IC package 205 and the interposer 230. Also in some embodiments, the pair of electrical interconnect pads 231 on the interposer 230 are elongated on a common axis toward each other. In still further embodiments, both the pair of electrical interconnect pads 260 and the pair of electrical interconnect pads 231 are elongated on common axes to reduce an effective distance between the conductive elements at the transition between the IC package 205 and the interposer 230. These and other embodiments are further described below.

Figure 3B:
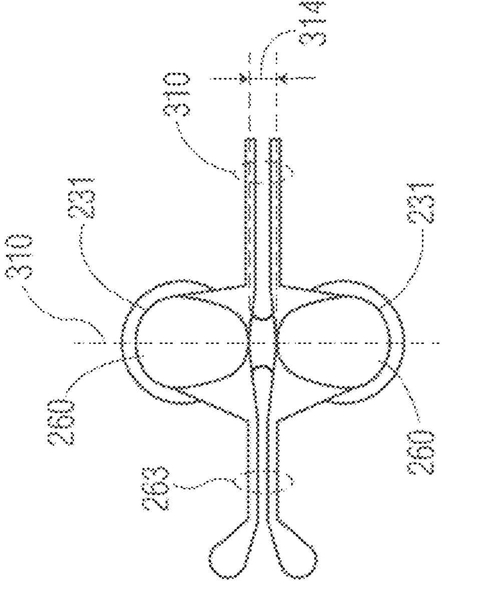
FIGS. 3A and 3B are top plan view illustrations of electrical interconnects between devices represented in FIG. 2A.
Figure 3A:
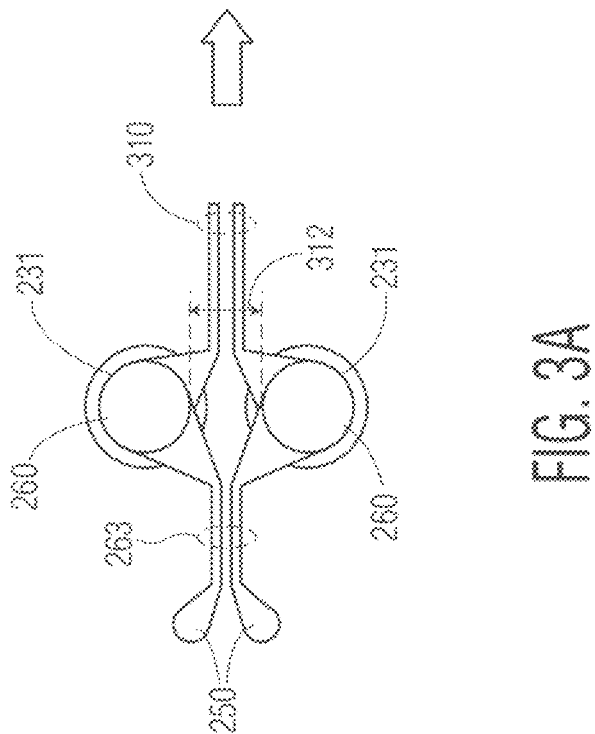

FIGS. 3A and 3B are top plan view illustrations of electrical interconnects between devices represented in FIG. 2A. As shown in FIG. 3A, conductive traces 263 form a transmission line between electrical interconnects 250 on IC package 205 and electrical interconnect pads 260. Also shown in FIG. 3A are electrical interconnect pads 231 (shown superimposed on electrical interconnect pads 260) coupled to conductive traces 310. Conductive traces 310 are formed on the interposer 230 with a spacing suitable form an RF transmission line and to provide an efficient conductive path for RF energy. For example, in some embodiments, conductive traces 310 may terminate at a launcher, such as launcher 235 (FIG. 2), or may terminate at a different RF transition structure. In the example of FIG. 3A, both electrical interconnect pads 260 and electrical interconnect pads 231 are circular, which after a solder reflow operation, provides a distance represented by dimension 312 between conductive elements at the transition between the IC package 205 and the interposer 230. As seen in FIG. 3A, dimension 312 is larger than the spacing of either the pair of conductive traces 263 on the IC package 205 or the pair of conductive traces 310 on the interposer 230. The increased distance represented by dimension 312 results in insertion loss and reduced efficiency when conducting RF energy across the transition between the IC package 205 and the interposer 230.

FIG. 3B shows one or more electrical interconnect pads elongated in a manner that reduces the distance between conductors at the transition between the IC package 205 and the interposer 230. For example, in some embodiments, the pair of electrical interconnect pads 260 located on the IC package 205 and coupled to the pair of conductive traces 263 may be elongated towards each other on a common axis, such as axis 310. Also for example, in some embodiments, the pair of electrical interconnect pads 231 located on the interposer 230 and coupled to the pair of conductive traces 310 may be elongated towards each other on a common axis, such as axis 310. During a solder reflow operation, solder flows to occupy space between the elongated pairs of electrical interconnect pads in the direction of the common axis, thereby reducing the distance (shown by dimension 314) between conductors at the transition between the IC package 205 and the interposer 230.

As used herein, the phrase “elongated on a common axis,” refers to any noncircular shape that includes a component in the direction of the common axis. For example, some embodiments include a noncircular shape that is elongated directly along the common axis in a direction towards the second pad in the pair. Also for example, some embodiments include a noncircular shape that is elongated at an angle relative to the common axis (e.g., 10, 30, 45 degrees, etc.). Because the elongation at an angle maintains a component on the common axis, these embodiments are still considered to be “elongated on a common axis.” Similar phrases such as “in a direction of a common axis,” “flow on a common axis,” and the like, also refer to directions, flows, movement, or the like having at least a component in the direction of the common axis. For example, solder may flow at 45 degrees relative to a common axis, while still “flowing on the common axis” or “flowing in a direction of the common axis,” in part because a component of the flow is on the common axis.

FIG. 3B shows elongation of both pairs of electrical interconnect pads 260 and 231 towards each other on common axis 310, although not all embodiments are limited in this manner. For example, in some embodiments, electrical interconnect pads 260 are elongated, and electrical interconnect pads 231 are not elongated. Also for example, in some embodiments, electrical interconnect pads 231 are elongated, and electrical interconnect pads 260 are not elongated. Any combination of pairs of elongated pads or pairs of elongated pads and non-elongated pads may be utilized in the various embodiments.

Figure 4A:
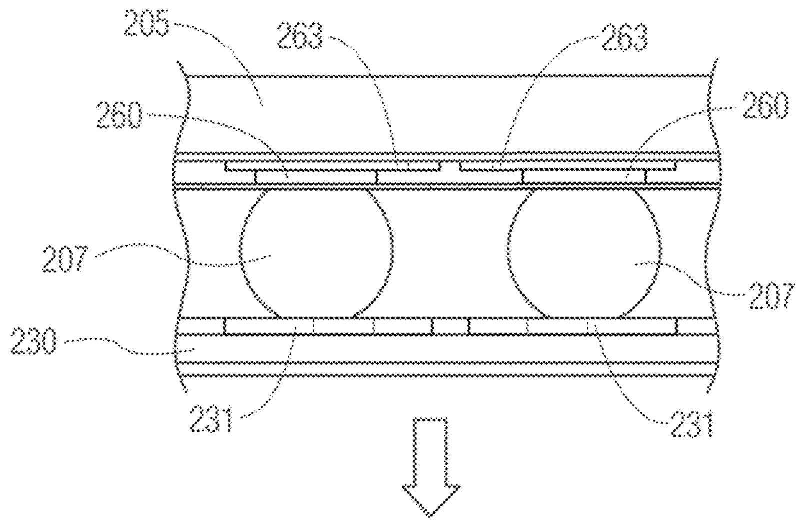
FIG. 4A is a cross-sectional illustration showing solder balls between an integrated circuit device and interposer circuit board prior to solder reflow.

FIG. 4A is a cross-sectional illustration showing solder balls between an integrated circuit device and interposer circuit board prior to solder reflow. The cross section of FIG. 4A shows the IC package 205 and the interposer 230 with solder balls 207 positioned between pairs of electrical interconnect pads. The IC package 205 has the pair of conductive traces 263 and the pair of electrical interconnect pads 260 formed on an underside thereof. In some embodiments, the pair of conductive traces 263 are formed in a polymer layer on the underside of the IC package 205. For example, a redistribution layer may be formed using a polymer layer that incorporates conductive traces to redistribute interconnect from an IC within IC package 205. In some embodiments, the pair of electrical interconnect pads 260 may be formed in a metallization layer that makes electrical contact with traces in the polymer layer. For example, the pair of electrical interconnect pads 260 may be formed in an under-bump metallization layer formed on a redistribution layer that is formed on the underside of the IC package 205.

The interposer 230 has a pair of electrical interconnect pads 231 formed on a surface of the interposer 230 as described above with reference to previous figures. In embodiments represented by FIG. 4A, the pair of electrical interconnect pads 231 are elongated on a common axis in the plane of the page.

Figure 4B:
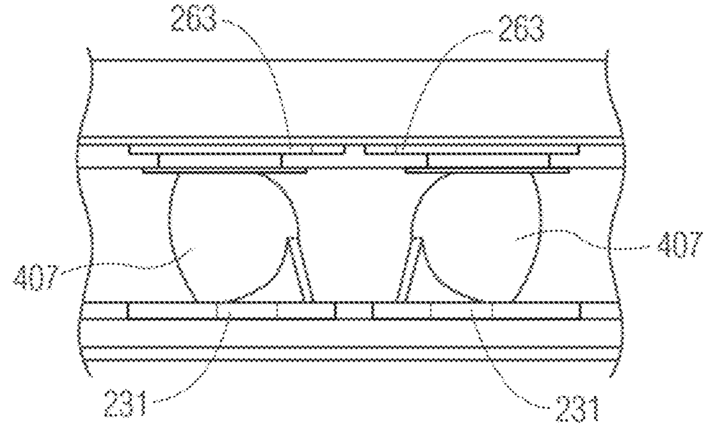
FIG. 4B is a cross-sectional illustration showing solder connections between an integrated circuit device and interposer circuit board after solder reflow.
Figure 4C:
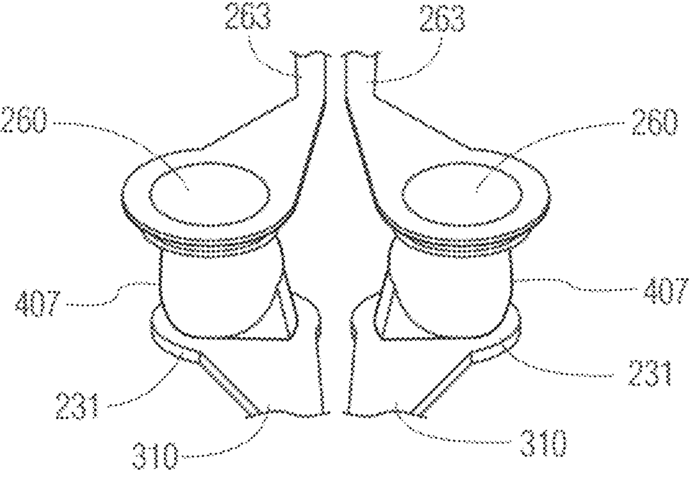
FIG. 4C is an isometric view illustration showing the solder connections of FIG. 4B.

FIGS. 4B and 4C show solder connections between the IC package 205 and the interposer 230 after a solder reflow operation. FIG. 4B is a cross-sectional illustration showing the solder connections, and FIG. 4C is an isometric view illustration showing the solder connections. During a solder reflow operation, solder from solder balls 207 flows in a direction along the common axis to produce solder connections 407. Solder connections 407 flow towards each other on a common axis along solderable surfaces on any pair of elongated electrical interconnect pads. For example, as shown in FIGS. 4B and 4C, when the pair of electrical interconnect pads 231 are elongated on a common axis, the resulting solder connections 407 flow towards each other along the solderable surfaces of the elongated electrical interconnect pads 231, reducing the distance between the electrical conductors near the surface of the interposer 230. In some embodiments, the pair of electrical interconnect pads 260 on the underside of the IC package 205 are elongated on a common axis, and during solder reflow, the solder flows along the elongated solderable surfaces of the pair of electrical interconnect pads 260 and reduces the distance between the resulting conductors near the surface of the IC package 205. In still further embodiments, both of the pairs of electrical interconnect pads 260 and 231 are elongated on common axes, and the solder flows in a manner that reduces the distance between conductors near both the surface of the IC package 205 and the surface of the interposer 230.

In some embodiments, the conductive traces 263 are eliminated, and solder balls 207 make direct contact with electrical interconnect pads on an integrated circuit die such as the IC 210. In these embodiments, a polymer layer on the underside of the IC 210 or the IC package 205 may be omitted, and electrical interconnections may be made directly to the IC 210. In these embodiments, the electrical interconnect pads 260 may be formed directly on the IC to make electrical connections through solder balls 207 to the interposer 230. Further, in some embodiments, the electrical interconnect pads formed directly on the IC 210 may be elongated on a common axis. Also in some embodiments, the electrical interconnect pads on the IC 210 may be circular and the electrical interconnect pads on the interposer 230 may be elongated on the common axis.

Figure 5:
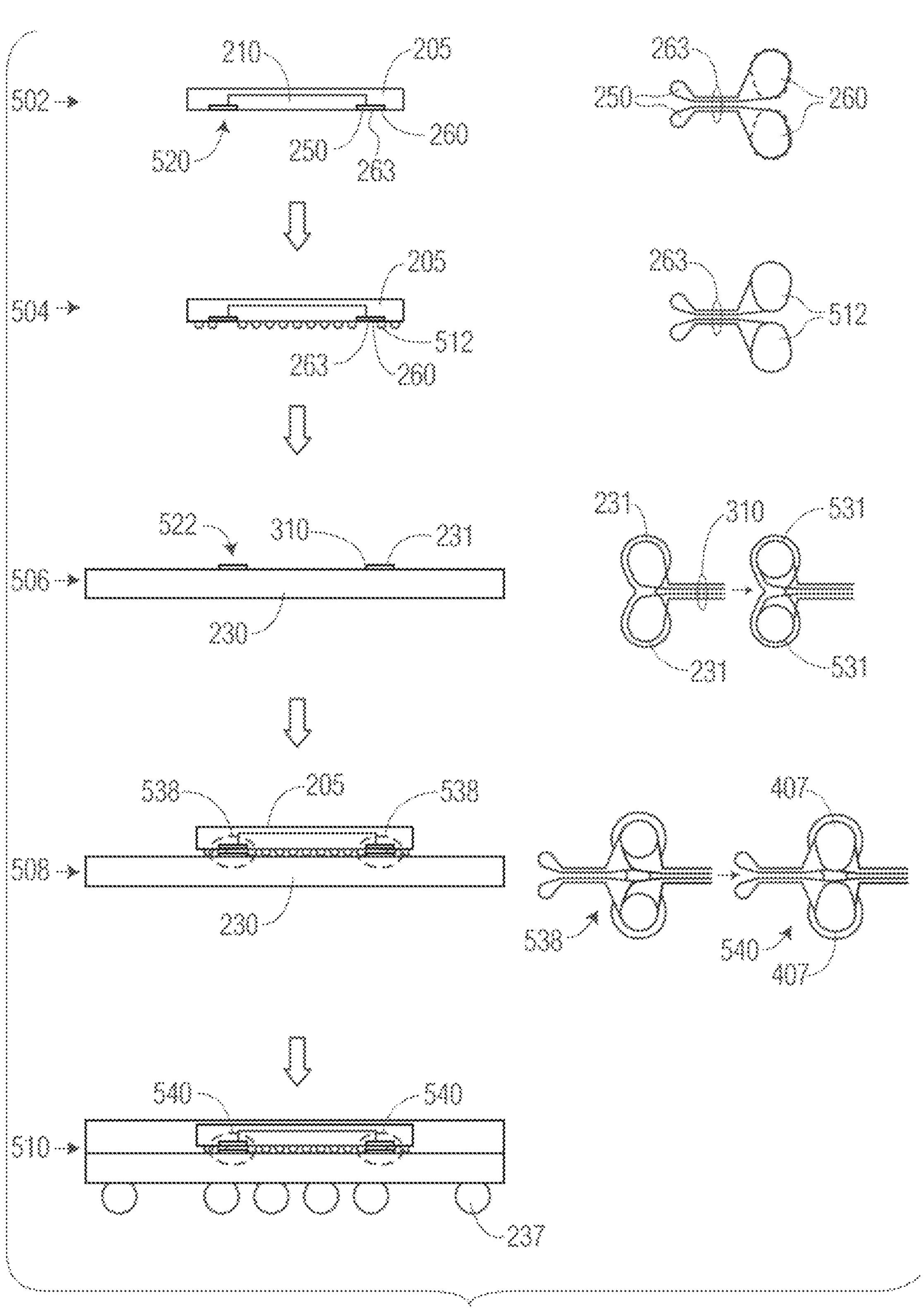
FIG. 5 shows an example process flow in accordance with various embodiments.

FIG. 5 shows an example process flow in accordance with various embodiments. At 502, elongated electrical interconnect pads 260 are formed on an integrated circuit device to provide a solderable surface. In some embodiments, elongated electrical interconnect pads 260 are formed directly on the IC 210, and in other embodiments, elongated electrical interconnect pads 260 are formed on a surface other than directly on a bare integrated circuit die. For example, in some embodiments, the IC 210 is molded to form the IC package 205, and a polymer layer may be formed on the underside of the IC package 205 to provide conductive paths such as the pair of conductive pads 263 between integrated circuit interconnects 250 on the underside of the IC package 205 and the electrical interconnect pads 260. Also for example, a metallization layer may be formed on the polymer layer to provide a solderable surface. In some embodiments, the metallization layer includes the pair of elongated pads 260 that are elongated on a common axis in a direction toward each other. As shown at 502, more than one pair of elongated electrical interconnect pads may be included on a single IC package. For example, a first pair is shown on the underside of the IC package 205 at 260 along with conductive traces 263 and IC interconnects 250, and a second pair of elongated electrical interconnect pads is shown generally at 520. Any number of pairs of elongated electrical interconnect pads may be included on the IC package 205 or the IC 210.

At 504, solder balls are deposited on the pair of elongated electrical interconnect pads 260, and a first solder reflow operation is performed. During the solder reflow operation, the solder wets the solderable surfaces of the pair of elongated electrical interconnect pads 260, resulting in the elongated solder balls shown at 512.

At 506, an interposer circuit board 230 is fabricated. In some embodiments, the interposer circuit board includes elongated electrical interconnect pads 231 coupled to a pair of conductive paths 310 having a spacing to form an RF transmission line. Further, in some embodiments, the interposer 230 may include an RF launcher, or other transition mechanism to conduct RF energy off of, or away from, the interposer circuit board 230. Solder paste may be applied to the elongated electrical interconnect pads 231 as shown at 531. As shown at 506, more than one pair of elongated electrical interconnect pads may be included on a single interposer circuit board. For example, a first pair is shown at 231, along with conductive paths 310, and a second pair is shown generally at 522. Any number of pairs of elongated electrical interconnect pads may be included on the interposer circuit board 230.

At 508, the IC package 205 is placed on the interposer circuit board 230 in a manner that superimposes the elongated electrical interconnect pads 260 on the IC package 205 with the elongated electrical interconnect pads 231 on the interposer circuit board as shown at 538. A second solder reflow operation is then performed to provide an electrical and mechanical coupling between the electrical interconnect pads 260 on the IC package 205 and the electrical interconnect pads 231 on the interposer circuit board 230. The resulting RF transition structure is shown at 540 with solder connections 407 resulting from solder flowing in a direction of the common axis upon which the pairs of electrical interconnect pads have been elongated. At 510, the IC package 205 is molded over on the interposer circuit board 230, and solder balls 237 are applied to the underside of the interposer circuit board 230. The resulting system shown at 510 includes an integrated circuit device coupled to an interposer circuit board where the coupling mechanism includes at least one RF transition structure with reduced insertion loss as a result of one or more pairs of electrical interconnect pads having been elongated on a common axis. The integrated circuit device may include a bare integrated circuit die, or may include a bare integrated circuit die along with a package structure that provides a surface for a polymer redistribution layer to redistribute electrical interconnects from the integrated circuit package die to a larger footprint provided by the integrated circuit package and a metallization layer to provide solderable surfaces. The integrated circuit board interposer may also include one or more pairs of elongated electrical interconnect pads coupled to one or more pairs of conductive paths having spacing to provide an RF transmission line on or in the interposer circuit board, and may also optionally include a launcher or other RF transition structure.

Figure 6:
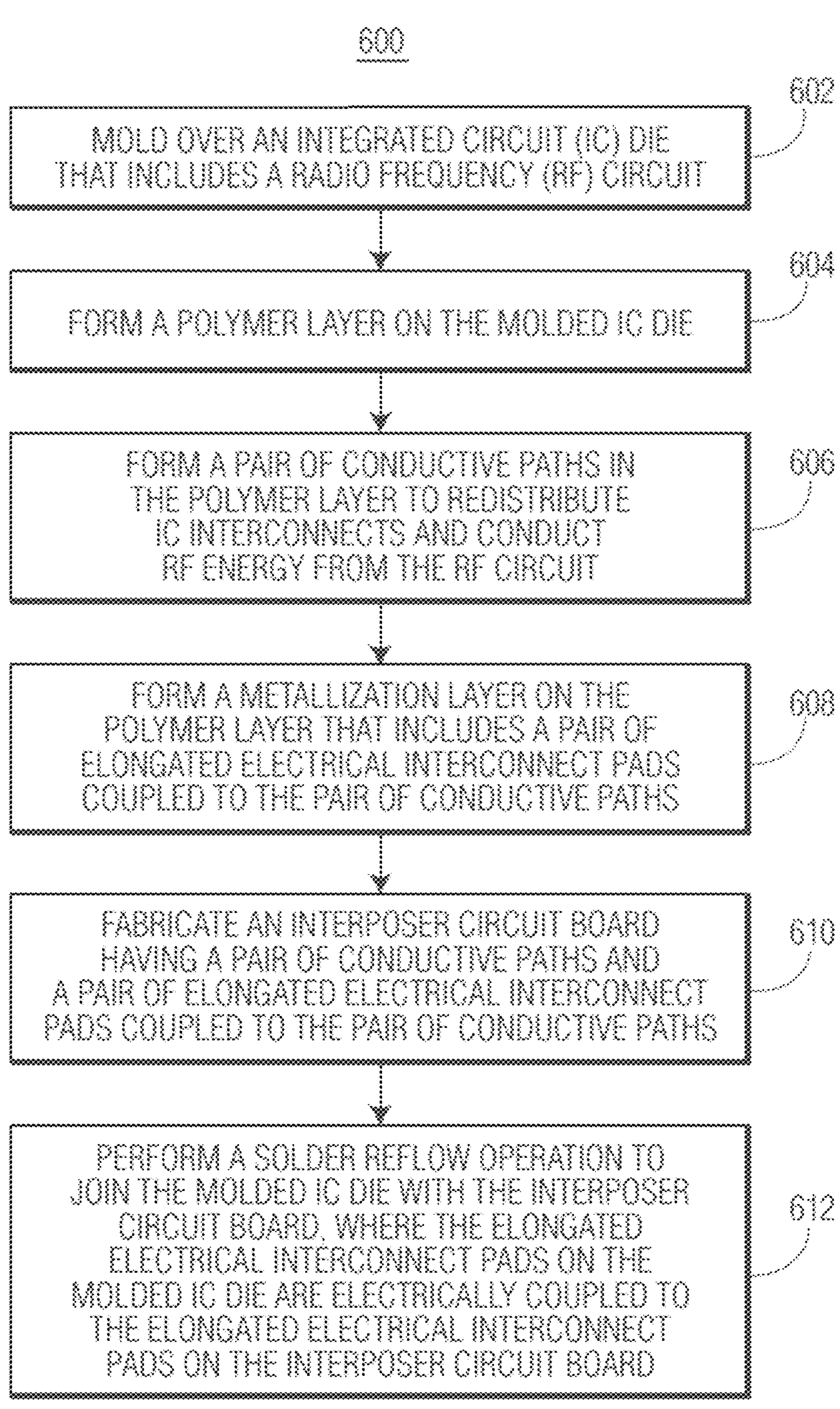
FIG. 6 is a flowchart representing example methods in accordance with various embodiments.

FIG. 6 is a flowchart representing example methods in accordance with various embodiments. At 602, an integrated circuit die that includes a radiofrequency circuit is molded over. In some embodiments, this corresponds to a bare integrated circuit die (e.g., the IC 210) that includes a millimeter-wave circuit (e.g., an amplifier, transmitter, receiver, etc.) being molded over to produce a molded IC die that has a larger footprint than the bare IC die itself. For example, the IC package 205 may result from molding over the IC 210 to provide a molded IC die having a larger footprint suitable for forming interconnect, such as a ball grid array interconnect.

At 604, a polymer layer is formed on the molded IC die. In some embodiments, this may correspond to a redistribution layer being formed on the underside of a molded IC die, such as the IC package 205, to redistribute interconnect from the IC 210 to a different footprint, possibly having a larger pitch. At 606, a pair of conductive paths are formed in the polymer layer to redistribute IC interconnects and conduct RF energy from the RF circuit included in the IC die. In one example, a pair of conductive paths 263 may be formed between IC interconnects 250 and the pair of conductive electrical pads 260.

At 608, a metallization layer is formed on the polymer layer that includes at least one pair of elongated electrical interconnect pads having solderable surfaces coupled to the pair of conductive pads. For example, an under-bump metallization layer may be formed on the underside of the molded IC die, and the resulting solderable surfaces may include metal contacts that form the electrical interconnect pads 260 that are elongated on a common axis towards each other.

At 610, an interposer circuit board having a pair of conductive paths and a pair of elongated electrical interconnect pads coupled to the pair of conductive paths is fabricated. In some embodiments, this corresponds to fabricating an interposer circuit board using a circuit board substrate and forming the pair of elongated electrical interconnect pads out of circuit board traces where solderable surfaces have been elongated on a common axis toward each other.

At 612, a solder reflow operation is performed to join the molded IC die with the interposer circuit board, where the elongated electrical interconnect pads on the molded IC die are electrically coupled to the elongated electrical interconnect pads on the interposer circuit board. The actions of 612 correspond to embodiments in which both the pairs of electrical interconnect pads on an IC package and on an interposer circuit board are elongated on a common axis or on common axes. In some embodiments, a pair of electrical interconnect pads on an IC package are elongated and a corresponding pair of electrical interconnect pads on an interposer circuit board are not elongated. Similarly, in some embodiments, a pair of electrical interconnect pads on an IC package are not elongated and a corresponding pair of electrical interconnect pads on an interposer circuit board are elongated. In still further embodiments, a pair of electrical interconnect pads are formed directly on a bare IC die, and that pair of electrical interconnect pads are joined with electrical interconnect pads on an interposer circuit board at 612.

It will be appreciated that ICs, IC packages coupled to interposers, and interposers coupled to ICs or IC packages according to embodiments herein (e.g., IC 210, IC package 205, interposer 230, etc.) can be over molded or otherwise encapsulated to produce a package or interposer with or without an integrated launcher (e.g., as an alternative to the package 105). It will be further appreciated that such interposers, packages, or ICs can be molded or encapsulated in-place after being coupled to another circuit board or other substrate. Such encapsulated structures may also be shielded by enclosing or otherwise surrounding them in suitably conductive material. Thus, in one or more embodiments, an IC coupled to an interposer is encapsulated in polymeric material. In one or more embodiments, such an IC is surrounded by a conductive structure that shields the IC from receiving or generating wireless signal interference.

FIGS. 7A-7C are cross-sectional illustrations showing example embodiments of systems that include RF transitions. Systems 710, 720, and 730 represent example systems that include an integrated circuit device having an RF transition to an interposer circuit board as described herein. For example, each of the systems 710, 720, and 730 may include a bare integrated circuit die coupled to an interposer circuit board utilizing at least one pair of elongated electrical interconnect pads, or may include a packaged integrated circuit die coupled to an interposer circuit board utilizing at least one pair of elongated electrical interconnect pads.

In the example embodiment of FIG. 7A, system 710 is coupled to a printed circuit board 712 which includes an antenna or launcher device. In these embodiments, the interposer circuit board included within system 710 acts as an RF pass-through device that passes the RF signal from the integrated circuit device through the interposer circuit board to the printed circuit board 712 to provide RF energy to the antenna or launcher on the printed circuit board 712.

In the example embodiment of FIG. 7B, system 720 is coupled to a printed circuit board 722 having a waveguide, and the printed circuit board 722 is coupled to an antenna device 724. In these embodiments, the interposer circuit board included within system 720 may include a launcher that launches the RF energy to the waveguide within the printed circuit board 722.

In the example embodiment of FIG. 7C, system 730 is coupled to a printed circuit board 732. In embodiments represented by FIG. 7C, the interposer circuit board within system 730 includes an antenna. As shown in FIGS. 7A-7C, interposer circuit boards that are coupled to integrated circuit devices by low loss RF transitions as described herein may take many forms, and may include or exclude different RF elements such as antennas, launchers, waveguides, and the like.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent exemplary functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in one or more embodiments of the depicted subject matter.

What is claimed is:

1. A system comprising:

an integrated circuit device having a first pair of electrical interconnect pads with solderable surfaces; and an interposer circuit board having a second pair of electrical interconnect pads with solderable surfaces, the second pair of electrical interconnect pads being configured to provide electrical coupling to the first pair of electrical interconnect pads through solder connections, and having a first pair of conductive paths spaced to create a radio frequency (RF) transmission line, wherein the first pair of conductive paths are electrically coupled to the second pair of electrical interconnect pads, wherein the interposer circuit board includes an RF launcher electrically coupled to the RF transmission line on the interposer circuit board;

wherein the first pair of electrical interconnect pads are noncircular and elongated on a common axis and are configured, during a solder reflow process, to cause solder to flow in a direction of the common axis to form an RF transition between the integrated circuit device and the interposer circuit board.

2. The system of claim 1, wherein the first pair of electrical interconnect pads are elongated directly toward each other on the common axis.

3. The system of claim 1, wherein the first pair of electrical interconnect pads are elongated at an angle relative to the common axis, to provide a component of elongation on the common axis.

4. The system of claim 1, wherein the first pair of electrical interconnect pads are arranged according to a first pitch, the second pair of electrical interconnect pads are arranged according to a second pitch, and the first pitch and second pitch are equal.

5. The system of claim 1, wherein the first pair of electrical interconnect pads are arranged according to a first pitch, the second pair of electrical interconnect pads are arranged according to a second pitch, and the first pitch and second pitch are unequal.

6. The system of claim 1, wherein the integrated circuit device includes a bare integrated circuit die, and wherein the first pair of electrical interconnect pads are formed on the bare integrated circuit die.

7. The system of claim 1, wherein the first pair of electrical interconnect pads are noncircular and elongated, and wherein the RF transition between the integrated circuit device and the interposer circuit board is formed between the first pair of electrical interconnect pads and the second pair of electrical interconnect pads.

8. A system comprising:

an integrated circuit device having a first pair of electrical interconnect pads with solderable surfaces, wherein the integrated circuit device comprises:

a bare integrated circuit die;

a polymer layer formed on the bare integrated circuit die, wherein the polymer layer includes a plurality of conductive traces to redistribute electrical connections from the bare integrated circuit die; and a metallization layer formed on the polymer layer, wherein the metallization layer includes the first pair of electrical interconnect pads having solderable surfaces;

an interposer circuit board having a second pair of electrical interconnect pads with solderable surfaces, the second pair of electrical interconnect pads being configured to provide electrical coupling to the first pair of electrical interconnect pads through solder connections, and having a first pair of conductive paths spaced to create a radio frequency (RF) transmission line, wherein the first pair of conductive paths are electrically coupled to the second pair of electrical interconnect pads;

wherein the first pair of electrical interconnect pads are noncircular and elongated on a common axis and are configured, during a solder reflow process, to cause solder to flow in a direction of the common axis to form an RF transition between the integrated circuit device and the interposer circuit board.

9. An interposer circuit board comprising:

a first pair of conductive paths having a first spacing to create a radio frequency (RF) transmission line; and a first pair of electrical interconnect pads having solderable surfaces configured to be electrically coupled to an integrated circuit device using solder connections, wherein the first pair of electrical interconnect pads have a second spacing greater than the first spacing;

an RF launcher electrically coupled to the RF transmission line;

wherein the first pair of electrical interconnect pads are electrically coupled to the RF transmission line, the first pair of electrical interconnect pads being noncircular and elongated on a common axis and are configured, during a solder reflow process, to cause solder to flow in a direction of the common axis to form an RF transition between the integrated circuit device and the interposer circuit board.

10. The interposer circuit board of claim 9, further comprising a plurality of noncircular, elongated pairs of electrical interconnect pads, and wherein the first pair of electrical interconnect pads is one of the plurality of noncircular, elongated pairs of electrical interconnect pads.

11. The interposer circuit board of claim 9, further comprising a plurality of electrical interconnect pads arranged in a pattern corresponding to an arrangement of contacts of a ball grid array (BGA) package, wherein the plurality of electrical interconnect pads comprise the first pair of electrical interconnect pads.

12. The interposer circuit board of claim 9, wherein the first pair of electrical interconnect pads are elongated directly toward each other on the common axis.

13. The interposer circuit board of claim 9, wherein the first pair of electrical interconnect pads are elongated at an angle relative to the common axis, to provide a component of elongation on the common axis.

14. An integrated circuit device comprising:

a radio frequency (RF) circuit configured to produce RF energy; and a first pair of electrical interconnect pads with solderable surfaces configured to provide electrical coupling to a circuit board using solder connections;

wherein the first pair of electrical interconnect pads are electrically coupled to the RF circuit to conduct the RF energy, the first pair of electrical interconnect pads being noncircular and elongated on a common axis and are configured, during a solder reflow process, to cause solder to flow in a direction of the common axis to form an RF transition between the integrated circuit device and the circuit board.

15. The integrated circuit device of claim 14, wherein the integrated circuit device includes a bare integrated circuit die, and wherein the first pair of electrical interconnect pads are formed on the bare integrated circuit die.

16. The integrated circuit device of claim 14, further comprising:

a bare integrated circuit die that includes the RF circuit;

a polymer layer formed on the bare integrated circuit die, wherein the polymer layer includes a plurality of conductive traces to redistribute electrical connections from the bare integrated circuit die; and a metallization layer formed on the polymer layer, wherein the metallization layer includes the first pair of electrical interconnect pads with solderable surfaces.

17. The integrated circuit device of claim 14, further comprising a plurality of noncircular, elongated pairs of electrical interconnect pads, and wherein the first pair of electrical interconnect pads is one of the plurality of non-circular, elongated pairs of electrical interconnect pads.

18. The integrated circuit device of claim 14, further comprising a plurality of electrical interconnect pads arranged in a pattern corresponding to an arrangement of contacts of a ball grid array (BGA) package, wherein the plurality of electrical interconnect pads comprise the first pair of electrical interconnect pads.

19. A method comprising:

fabricating an interposer circuit board having a first pair of conductive paths spaced to form a radio frequency (RF) transmission line, and having a first pair of electrical interconnect pads with solderable surfaces being noncircular and elongated on a common axis, wherein the first pair of electrical interconnect pads are electrically coupled to the RF transmission line, wherein the interposer circuit board includes an RF launcher electrically coupled to the RF transmission line on the interposer circuit board; and electrically coupling an integrated circuit device to the interposer circuit board, wherein the electrically coupling comprises performing a solder reflow operation to allow solder to flow in a direction of the common axis of the first pair of electrical interconnect pads.

20. The method of claim 19, wherein the integrated circuit device includes a pair of circular electrical interconnect pads spaced to be electrically coupled to the first pair of electrical interconnect pads on the interposer circuit board.

21. The method of claim 19, wherein the integrated circuit device includes a pair of noncircular electrical interconnect pads spaced to be electrically coupled to the first pair of electrical interconnect pads on the interposer circuit board.

22. The method of claim 19, further comprising:

molding over an integrated circuit die to produce a molded integrated circuit device, wherein the integrated circuit die includes an RF circuit configured to produce RF energy;

forming a polymer layer on the molded integrated circuit device, wherein the polymer layer includes a second plurality of conductive paths to redistribute interconnects on the molded integrated circuit device to a ball grid array pattern having a pitch compatible with the interposer circuit board, wherein a second pair of the second plurality of conductive paths are electrically coupled to conduct the RF energy; and forming a metallization layer on the polymer layer to form the integrated circuit device, wherein the metallization layer includes a second pair of electrical interconnect pads electrically coupled to the second pair of the second plurality of conductive paths on the polymer layer to conduct the RF energy, wherein the second pair of electrical interconnect pads are spaced to be electrically coupled to the first pair of electrical interconnect pads on the interposer circuit board during the solder reflow operation to form an RF transition between the integrated circuit device and the interposer circuit board.

23. The method of claim 22, wherein the second pair of electrical interconnect pads on the integrated circuit device are circular.

24. The method of claim 22, wherein the second pair of electrical interconnect pads on the integrated circuit device are noncircular.

25. A method comprising:

fabricating an interposer circuit board having a first pair of conductive paths spaced to form a radio frequency (RF) transmission line, and having a first pair of electrical interconnect pads with solderable surfaces being noncircular and elongated on a common axis, wherein the first pair of electrical interconnect pads are electrically coupled to the RF transmission line; and electrically coupling an integrated circuit device to the interposer circuit board, wherein the electrically coupling comprises performing a solder reflow operation to allow solder to flow in a direction of the common axis of the first pair of electrical interconnect pads;

molding over an integrated circuit die to produce a molded integrated circuit device, wherein the integrated circuit die includes an RF circuit configured to produce RF energy;

forming a polymer layer on the molded integrated circuit device, wherein the polymer layer includes a second plurality of conductive paths to redistribute interconnects on the molded integrated circuit device to a ball grid array pattern having a pitch compatible with the interposer circuit board, wherein a second pair of the second plurality of conductive paths are electrically coupled to conduct the RF energy; and forming a metallization layer on the polymer layer to form the integrated circuit device, wherein the metallization layer includes a second pair of electrical interconnect pads electrically coupled to the second pair of the second plurality of conductive paths on the polymer layer to conduct the RF energy, wherein the second pair of electrical interconnect pads are spaced to be electrically coupled to the first pair of electrical interconnect pads on the interposer circuit board during the solder reflow operation to form an RF transition between the integrated circuit device and the interposer circuit board.

26. The method of claim 25, wherein the second pair of electrical interconnect pads on the integrated circuit device are circular.

27. The method of claim 25, wherein the second pair of electrical interconnect pads on the integrated circuit device are noncircular.

* * * * *